(12) United States Patent
White et al.

(10) Patent No.: US 6,453,742 B1
(45) Date of Patent: Sep. 24, 2002

(54) SYSTEM AND METHOD FOR CALIBRATING SEMICONDUCTOR PROCESSING EQUIPMENT

(75) Inventors: Barton V. White, Oregon City, OR (US); Allen W. Kraxberger, Jr., Canby, OR (US)

(73) Assignee: SEH America, Inc., Vancouver, WA (US)

( * ) Notice: Subject to any disclaimer, the term of this patent is extended or adjusted under 35 U.S.C. 154(b) by 156 days.

(21) Appl. No.: 09/585,892

(22) Filed: May 31, 2000

(51) Int. Cl.[7] .................................................. G01P 3/02
(52) U.S. Cl. ........................................... 73/494; 73/660
(58) Field of Search ..................... 73/494, 493, 862.19, 73/168, 659, 862.33, 660; 324/162, 166

(56) References Cited

U.S. PATENT DOCUMENTS 4,656,875 A * 4/1987 Uitermarkt ............... 73/862.35
4,862,752 A * 9/1989 Hoyt ......................... 73/862.34
5,262,717 A * 11/1993 Bolegoh ................... 73/862.336
6,003,229 A * 12/1999 Beduhn et al. ............ 73/862.23

* cited by examiner

Primary Examiner—Helen Kwok
(74) Attorney, Agent, or Firm—Alston & Bird LLP

(57) ABSTRACT

A system for measuring the rotational speed of a shaft driven by a motor. The system includes a rotation measurement device having a rotatable sensor and configured to generate a signal corresponding to rotation of the sensor. The rotation measurement device may be supported by a fixture mountable on the motor. A coupler is associated with the sensor and includes a gripping surface configured to contact and grip the end-surface of the shaft to couple the sensor to the shaft and impart the rotation of the shaft to the sensor.

18 Claims, 4 Drawing Sheets

SYSTEM AND METHOD FOR CALIBRATING SEMICONDUCTOR PROCESSING EQUIPMENT

FIELD OF THE INVENTION

The present invention relates to equipment calibration, and more particularly to calibration of semiconductor processing equipment having motor-driven shafts.

BACKGROUND OF THE INVENTION

The manufacture of semiconductor substrates and devices typically requires many different types of semiconductor processing equipment for performing a variety of processing steps. The substrates and devices must be manufactured with extremely high levels of purity, uniformity and precision to ensure the desired chemical and structural properties are achieved. This requires accurate calibration of the semiconductor processing equipment to control the various parameters of the processing steps performed by the equipment.

Many types of semiconductor processing equipment including crystal growers, spin dryers, thin film deposition equipment, etching equipment, etc., apply motion to substrates or other materials during processing. In these types of equipment, values such as the speed and distance of motion become parameters which effect the result of the process. The motion is often imparted to the substrates or other materials by motors which drive a rotating shaft. Therefore, accurate measurement and calibration of the shaft rotation is necessary to control the process.

One method currently used to measure the rotation of the shaft includes visually monitoring a portion of the shaft while it is rotating, and counting the number of rotations during a selected time period. However, this method is limited to relatively slow speeds of a few hundred revolutions per minute (rpm). Since many motors are capable of driving a shaft at several thousand rpm, most of the range of these motors cannot be calibrated using this method.

Another method, used by military personnel to measure the rotation of military equipment such as motors, etc., involves connecting a rotary encoder to the shaft of the motor. In these military motors, at least one end of the shaft includes a tapered counter-sink adapted to receive a conical coupling. The conical coupling is attached to the rotary encoder and the coupling is pressed into the counter-sink and held in place by hand. The inward pressure on the coupling causes it to wedge in the counter-sink and grip the shaft. The rotation of the shaft is thereby imparted to the rotary encoder. One disadvantage of this method is that the user must hold the coupling in proper alignment with the counter-sink to ensure accurate reading. Furthermore, this method is not applicable to motors with shafts that do not include a tapered counter-sink.

SUMMARY OF THE INVENTION

The invention provides a system for measuring the rotational speed of a shaft driven by a motor. The system includes a rotation measurement device having a rotatable sensor and configured to generate a signal corresponding to rotation of the sensor. The rotation measurement device may be supported by a fixture mountable on the motor. A coupler is associated with the sensor and includes a gripping surface configured to contact and grip the end-surface of the shaft to couple the sensor to the shaft and impart the rotation of the shaft to the sensor. The system allows accurate calibration of a variety of different motion-dependent parameters for various semiconductor processing equipment.

DETAILED DESCRIPTION AND BEST MODE FOR CARRYING OUT THE INVENTION

Figure 1:
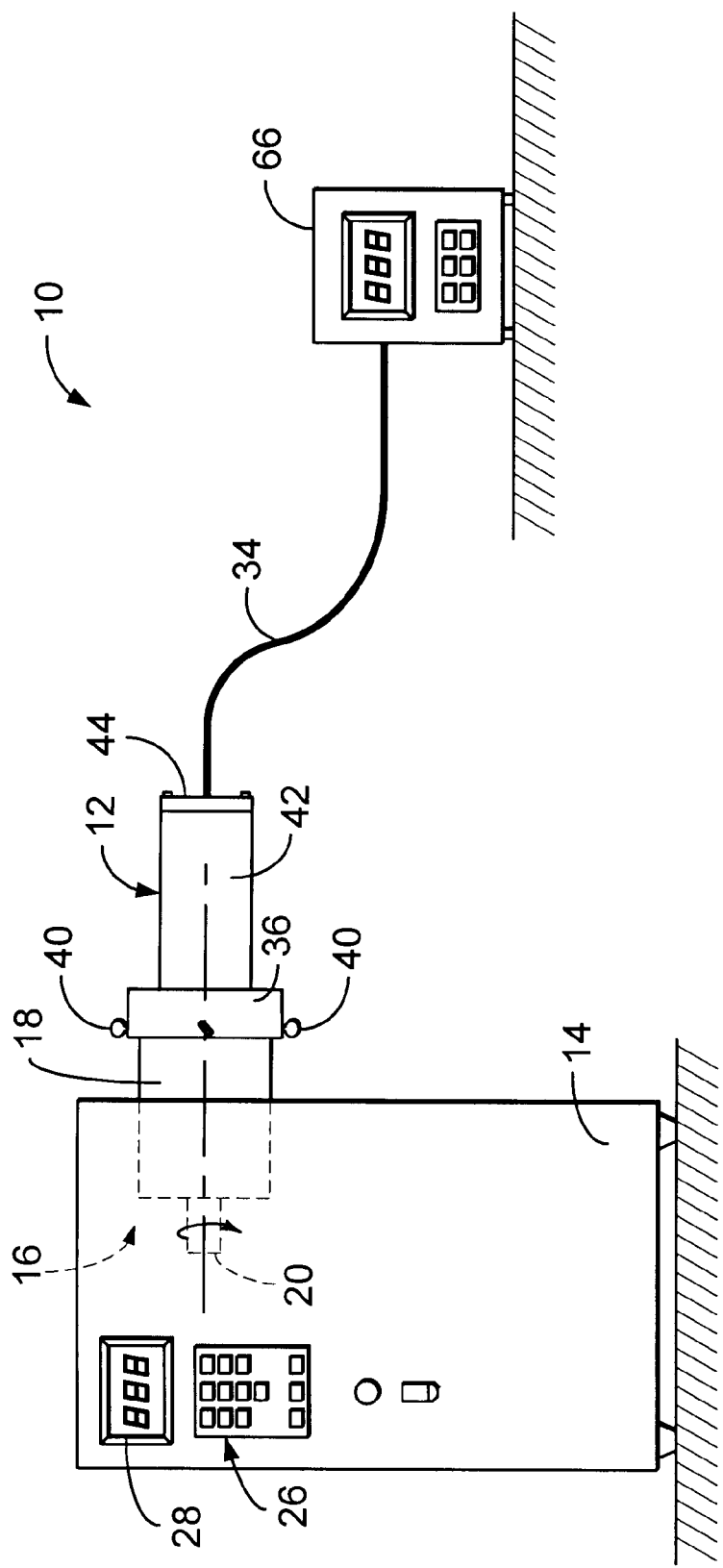
FIG. 1 is a schematic view of a system for measuring the rotation of a motor-driven shaft according to the present invention.

A system or apparatus for calibrating the rotation of a motor-driven shaft found on various types of semiconductor processing equipment is indicated generally at 10 in FIG. 1. System 10 includes a fixture 12 mountable on a motor to position a rotation measurement device adjacent a shaft extending from the motor. The system is configured to directly measure the rotation of a rotating shaft and to determine a desired value corresponding to the measured rotation. The determined value may be used to monitor and calibrate a process performed by semiconductor processing equipment.

In FIG. 1, semiconductor processing equipment 14 is shown schematically since it may be any type of semiconductor processing equipment having a motor-driven shaft. Typically, equipment 14 includes one or more drive assemblies 16, each including a motor 18 and a shaft 20. Motor 18 drives shaft 20 in rotation about the elongate axis of the shaft. The shaft is received within and extends from the front end of the motor to be coupled to a component (not shown) of equipment 14. It will be appreciated that shaft 20 may be coupled directly to the component or indirectly through one or more linkages, gears, etc. Shaft 20 also extends to the rear end of motor 18, where the end of the shaft is accessible.

Figure 2:
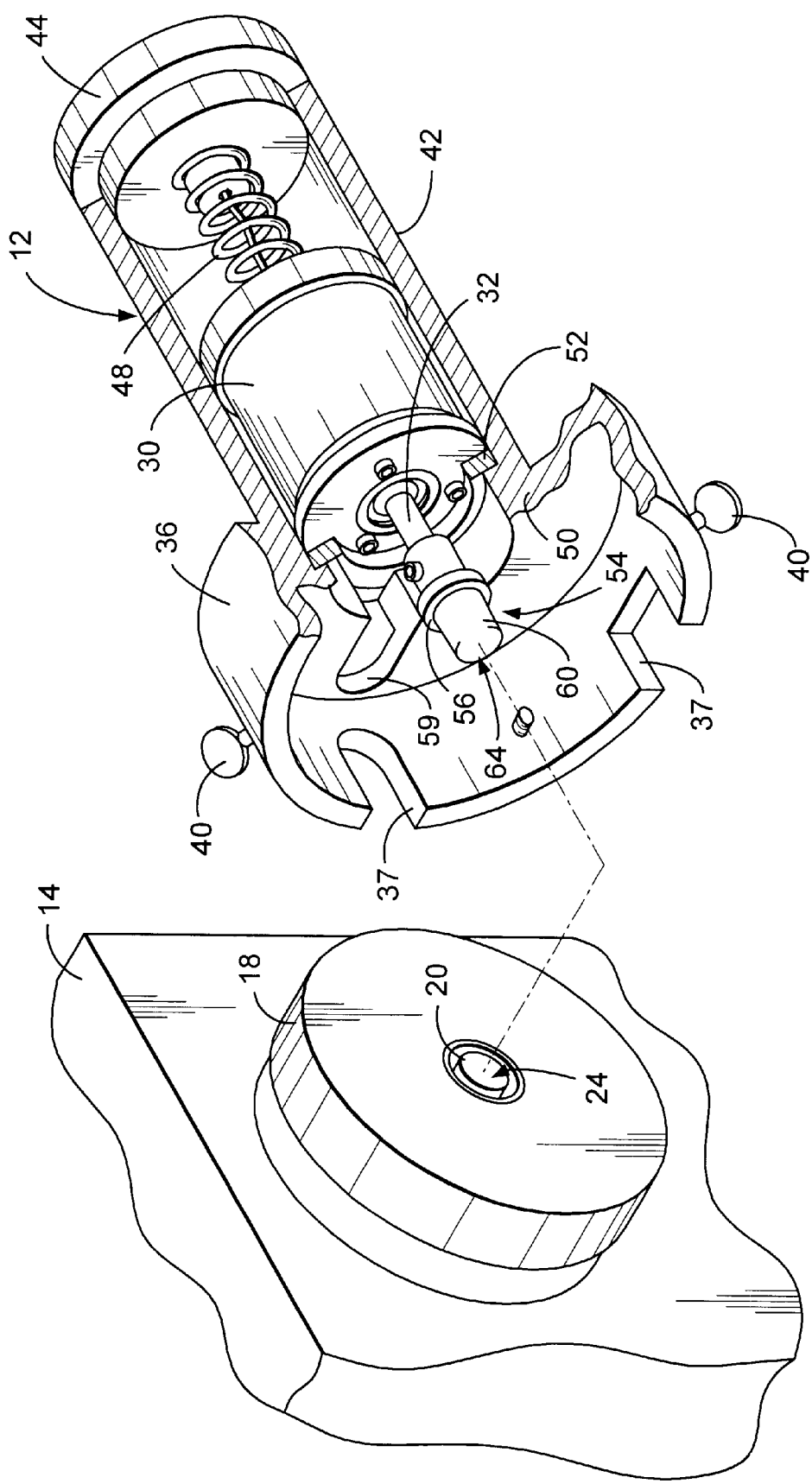
FIG. 2 is an isometric view showing a calibration apparatus according to the present invention.

Typically, the shaft is circular in lateral cross-section. However, it will be appreciated that system 10 may be used with shafts having any cross-sectional shape including rectangular, etc. In any event, the rear of shaft 20 has a substantially flat end-surface 24, as shown in FIG. 2. Typically, end-surface 24 is substantially flush with the end of motor 18. Alternatively, the end-surface may protrude beyond the end of motor 18 or be recessed within the motor.

Some types of semiconductor processing equipment may include a mechanism for measuring and displaying a value corresponding to the rotation of shaft 20. The mechanism may take any of a variety of forms which are known to those of skill in the art. In the exemplary embodiment depicted in FIG. 1, the mechanism takes the form of a motor speed controller 26 which is coupled to motor 18 to vary the power to the motor. Thus, the rotational speed of the shaft varies with the power to the motor. Controller 26 includes a display 28 adapted to display a value corresponding to the rotation of the shaft based on the power supplied to the motor. Controller 26 is adjustable to change the proportionality between the value displayed and the power supplied to the motor.

Figure 3:
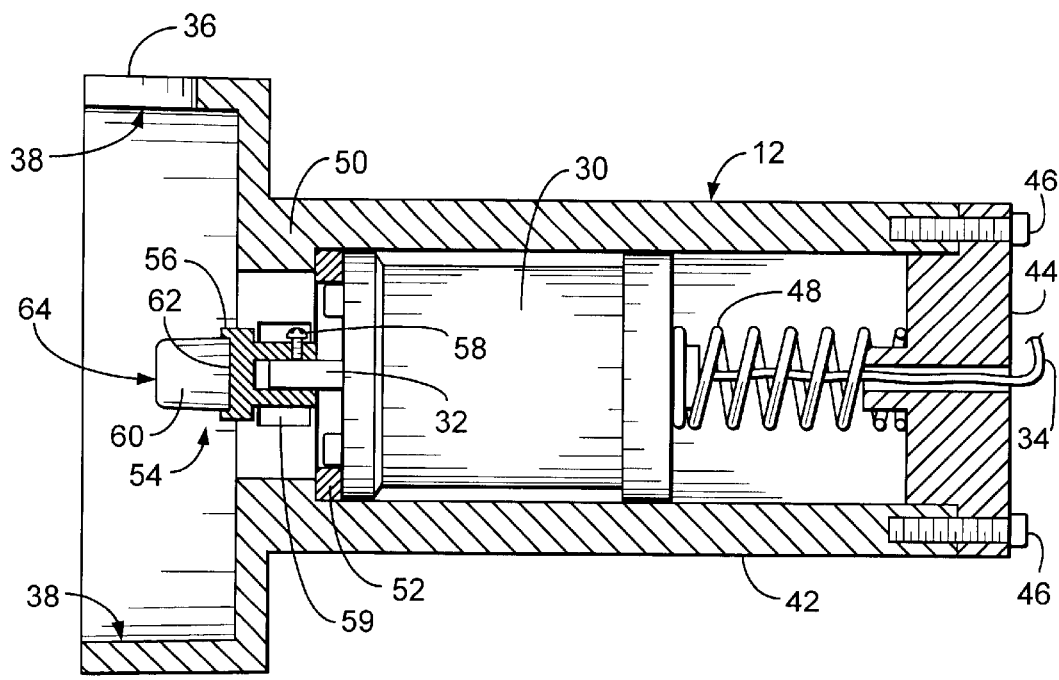
FIG. 3 is a side elevation and partial cross-sectional view showing the apparatus of FIG. 2 prior to mounting on the motor.
Figure 4:
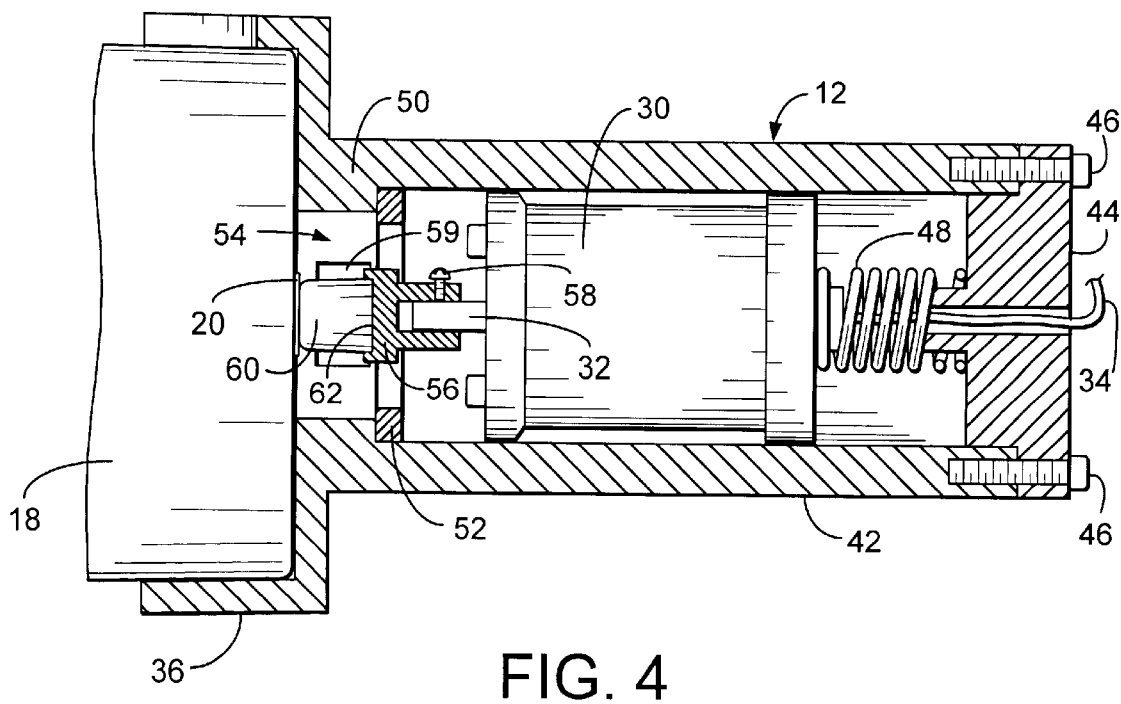
FIG. 4 is a side elevation and partial cross-sectional view showing the apparatus of FIG. 2 mounted on the motor.

As shown in FIGS. 2–4, system 10 includes a rotation measurement device 30 mounted within fixture 12. In the exemplary embodiment described below, the rotation measurement device takes the form of an optical rotary encoder such as is available from Omron Electronics Inc., of Schaumburg, Ill. However, many other brands and types of rotation measurement devices may be used within the scope of the invention, including magnetic-based sensor systems, mechanical sensors, etc.

Encoder 30 includes a rotatable sensor or shaft 32. The encoder is configured to generate a predetermined number of electrical pulses during each revolution of sensor 32. The electrical pulses are transmitted via cable 34 extending from the rear of the encoder.

Fixture 12 is adapted to support encoder 30 adjacent the shaft. The fixture includes a mounting collar 36 sized to fit around the rear end of the motor. The inner walls 38 of the mounting collar may be slightly flared outward to accommodate a similar taper on the rear end of motor 18. The collar may include one or more notches 37 to provide clearance around screws, cords, or other features on the surface of the motor. In any event, the fixture is removably mountable on the rear of the motor in a relatively tight and stable fit. For motors having a diameter smaller than the inside diameter of collar 36, an adjustment mechanism may be provided to align the fixture to the motor. In the exemplary embodiment, the adjustment mechanism includes one or more screws 40 threaded through collar 36 to press against and grip the end of the motor. Even where the collar fits relatively tightly around the motor, screws 40 may be used to ensure the fixture does not become dislodged from the motor.

Fixture 12 also includes a cylindrical housing 42 sized to hold encoder 30. An endcap 44 is attached to the rear end of the housing by one or more screws 46, and encloses the encoder within the housing. Cable 34 passes through an aperture in the endcap. The fit between encoder 30 and the inside diameter of housing 42 allows the encoder to slide axially within the housing. A compression spring 48 is disposed between endcap 44 and the rear of encoder 30 to bias the encoder toward the front end of the housing and collar 36.

Shaft 32 of the encoder passes through an aperture in housing 42 and extends into the space formed by collar 36. The front end of housing 42 includes one or more shoulders 50 which contain the encoder within the housing. A spacer ring 52 may be placed between the encoder and shoulder 50 to adjust the distance that shaft 32 extends out of housing 42 to accommodate motor shafts which are recessed within or protrude from the rear of the motor. Spring 48 is configured to maintain a bias on the encoder over substantially the full range of travel of the encoder within the housing.

System 10 also includes a coupler 54 associated with the rotatable sensor or shaft 32 of the encoder. Coupler 54 is adapted to couple shaft 32 of the encoder to shaft 20 of the motor, and thereby impart the rotation of shaft 20 to shaft 32 for measurement. Coupler 54 includes a fitting 56 adapted to slide unto the end of shaft 32. A set screw 58, which is accessible through an aperture 59 in the fixture, locks the fitting on the shaft. Coupler 54 also includes a gripping member 60 mounted on fitting 56. In the exemplary embodiment, gripping member 60 is mounted on fitting 56 by being press-fit into a recess 62 in the fitting. Alternatively, the gripping member may be mounted on the fitting in any of a variety of other ways including adhesive, etc.

Gripping member 60 includes a front surface 64 adapted to grip the flat end-surface 24 of motor-driven shaft 20. In the exemplary embodiment, gripping member 60 is constructed of a relatively high-friction material such as rubber. Typically, front surface 64 is substantially flat to maximize the contact area between the gripping member and shaft 20. As a result, front surface 64 frictionally grips end-surface 64 when the gripping member is placed into contact with the shaft.

As best seen in FIG. 4, fixture 12 is configured to automatically position coupler 54 in substantially coaxial contact with shaft 20 when the fixture is mounted on motor 18. By positioning and maintaining the coupler in a substantially coaxial relationship with the shaft, fixture 12 ensures an accurate measurement of the shaft rotation. In the exemplary embodiment, the coupler protrudes along the axial center of the collar to align with shaft 20 which extends through the center of the motor. Alternatively, collar 36 may be modified to displace the coupler from the axial center to conform to motors whose shafts are not centrally located.

When the fixture is mounted on the rear of motor 18, gripping member 60 contacts shaft 20 and is pressed backward against the bias of spring 48. The frictional force created between front gripping surface 64 and end-surface 24 depends upon the degree of compression of spring 48 as well as the strength of the spring. Preferably, the frictional force is sufficient to cause surface 64 to grip surface 24 strongly enough to overcome the inertia of shaft 32 and coupler 54, and translate the rotation of shaft 20 to shaft 32. Since coupler 54 is adapted to grip a shaft along a single end-surface of the shaft, the coupler may be used to grip the shafts of various drive assemblies regardless of whether the shaft is recessed within, flush with, or protruding from the motor.

Depending on the frictional force established between the gripping member and shaft 20, gripping surface 64 may slip against end-surface 24 until the rotation of shaft 32 approximates the rotation of shaft 20. As a result, gripping member 60 functions similar to a clutch and allows the fixture to be mounted on the motor while shaft 20 is rotating. Initially, surface 64 will slip against surface 24 because the rotational friction generated is insufficient to overcome the inertia of shaft 32 and coupler 54. However, the rotational friction will apply a rotation force to the shaft and coupler, causing the pieces to speed up (or slow down) to match the rotation of shaft 20. Once shaft 32 and coupler 54 have matched the rotational speed of shaft 20, surface 64 ceases to slip against surface 24.

It will be appreciated that the frictional coupling between the encoder and the shaft allows the fixture to be mounted on the motor while equipment 14 is processing semiconductor substrates or devices. Because the coupler is adapted to slip against the end-surface of shaft 20, the rotation of the shaft is not interrupted when the fixture is mounted on the motor. As a result, a single measurement system may be used to calibrate several pieces of semiconductor processing equipment without waiting for each piece of equipment to complete a processing step.

Returning attention to FIG. 1, system 10 also includes a display device 66 configured to display a value corresponding to the rotation of shaft 20 measured by encoder 30. Device 66 may take any of a variety of forms including a display mounted on fixture 12. In the exemplary embodiment, display device 66 is separate from the fixture and connected to the encoder by cable 34. The display device is adapted to receive the pulses produced by the encoder and transmitted via cable 34. Optionally, display device 66 may include a computer processor (not shown) programmable to determine a desired value based on the pulses received from the encoder. For example, the display device may be programmed to determine and display rotational speed (i.e., rpm) or acceleration. Alternatively, the display device may be programmed to determine and display a linear distance traveled by an object linked to the shaft (for example, through gears, tether, etc.). Display device 66 may be any of a variety of suitable display devices which are known to those of skill in the art. One example of a suitable display device is the RX-22 counter available from Keyence Corporation of America, of Wood cliff Lake, N.J.

Figure 5:
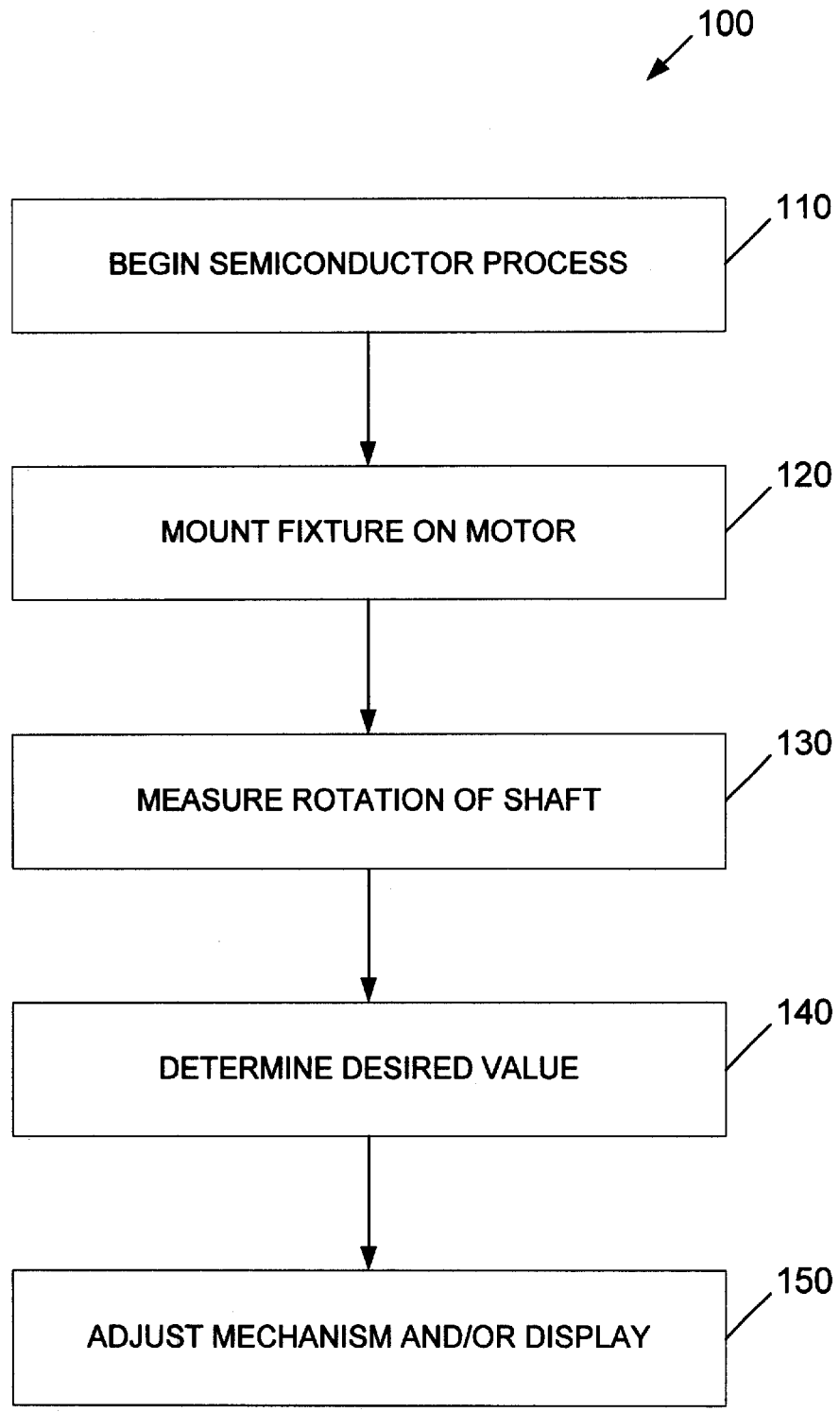
FIG. 5 is a flowchart diagram illustrating a method for calibrating semiconductor equipment according to the present invention.

As described above, system 10 allows the calibration of one or more process parameters for a variety of semiconductor processing equipment. A method for using system 10 to calibrate such equipment is indicated generally at 100 in FIG. 5. As discussed above, the calibration method may be initiated after the equipment has begun processing wafers. Thus, in the embodiment of the calibration method depicted in FIG. 5, the semiconductor process is begun, as indicated at step 110. Alternatively, the calibration method may be performed between processing steps when the equipment is idle. In any event, the fixture is then mounted to the motor at step 120. Once the rotatable sensor on the encoder matches rotational speed with the motor-driven shaft, the rotation is measured as indicated at step 130. Display device 66 then determines a desired value (e.g., rpm, etc.), at step 140. Typically, though not necessarily, the determined value is displayed by device 66.

Once the desired value is determined, the value is compared to the value measured by mechanism 26 and displayed by display 28 on the semiconductor processing equipment. If the determined value is different than the value displayed on the semiconductor processing equipment, then mechanism 26 and/or display 28 are adjusted until the displayed value agrees with the determined value, as indicated at step 150. Typically, the steps of measuring (130), determining (140) and adjusting (150) are repeated for a plurality of different rotational speeds to calibrate the equipment over a wide range of parameter values.

Industrial Applicability

This invention is applicable to semiconductor manufacturing, and is particularly applicable to calibrating equipment used in semiconductor manufacturing.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. No single feature, function, element or property of the disclosed embodiments is essential to all of the disclosed inventions. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

We claim:

1. A semiconductor equipment calibration apparatus for use on semiconductor processing equipment having at least one drive assembly including a shaft rotationally driven by a motor, where the shaft has a substantially flat end-surface, the apparatus comprising:
   a rotation measurement device having a rotatable sensor and configured to generate a signal corresponding to rotation of the sensor; and
   a coupler associated with the sensor and capable of being biased into engagement with the end-surface of the shaft as a result of axial movement of the coupler, where the coupler includes a gripping surface configured to contact and grip the end-surface of the shaft to couple the sensor to the shaft and translate rotation of the shaft to the sensor.

2. The apparatus of claim 1, where the gripping surface is configured to frictionally grip the end-surface.

3. The apparatus of claim 2, where the gripping surface is configured to slip against the end-surface until the rotation of the shaft is imparted to the sensor, so that the gripping surface may be placed in contact with the end-surface while the shaft is rotating.

4. The apparatus of claim 1, further comprising a fixture removably mountable on the motor and adapted to support the rotation measurement device.

5. The apparatus of claim 4, where the fixture is adapted to automatically position the coupler in contact with the shaft when the fixture is mounted on the motor.

6. The apparatus of claim 5, where the fixture includes a spring disposed to bias the coupler toward the end-surface when the fixture is mounted on the motor.

7. The apparatus of claim 5, where the fixture includes an adjustment mechanism to align the fixture to the motor.

8. The apparatus of claim 1, where the rotation measurement device includes an optical rotary encoder.

9. The apparatus of claim 1, further comprising a display device connected to receive the signal generated by the rotation measurement device and configured to display a value corresponding to rotation of the shaft.

10. A system for measuring the rotational speed of a shaft driven by a motor, where the shaft is received within and extends from the motor, the system comprising:
    a fixture removably mountable on the motor;
    a rotation measurement device supported by the fixture;
    a coupler mechanically connected to the rotation measurement device and adapted to grip the shaft and translate rotation of the shaft to the rotation measurement device for measurement; and
    a display device connected to the rotation measurement device and configured to produce a display corresponding to the rotation of the shaft measured by the rotation measurement device;
    where the fixture is configured to automatically position the coupler in contact with the shaft when the fixture is mounted on the motor.

11. The system of claim 10, where the fixture includes a spring positioned to bias the coupler toward the shaft when the fixture is mounted on the motor.

12. The system of claim 10, where the fixture includes an adjustment mechanism to align the fixture to the motor.

13. The system of claim 10, where the coupler is adapted to frictionally grip a single, flat surface on the shaft.

14. The system of claim 10, where the rotation measurement device includes a rotatable sensor and the coupler is adapted to impart the rotation of the shaft to the sensor.

15. The system of claim 14, where the rotation measurement device includes an optical rotary encoder.

16. A method of calibrating a parameter of semiconductor processing equipment adapted to process semiconductor substrates, where the semiconductor processing equipment includes a motor adapted to rotationally drive a shaft, and where a value of the parameter is at least partially dependent on rotation of the shaft, the method comprising:

providing an apparatus configured to measure rotational movement;

mounting the apparatus on the motor to measure rotation of the shaft while the shaft is rotating;

measuring the rotation of the shaft with the apparatus; and determining the value of the parameter based on the measured rotation;

where the mounting and measuring are performed while the semiconductor processing equipment is processing semiconductor substrates.

17. The method of claim 16, where the semiconductor processing equipment includes a mechanism for measuring rotation of the shaft and a display for displaying the value of the parameter based on the rotation measured by the mechanism, and where the method further comprises adjusting at least one of the mechanism or the display so that the displayed value corresponds to the determined value.

18. The method of claim 16, where the apparatus includes an optical rotary encoder.

* * * * *